United States Patent
Choi

[19]

[11] Patent Number: 5,886,932
[45] Date of Patent: Mar. 23, 1999

[54] COMPOSITE MODE SUBSTRATE VOLTAGE GENERATION CIRCUIT FOR DYNAMIC RANDOM ACCESS MEMORY

[75] Inventor: Joo Sun Choi, Ichon, Rep. of Korea

[73] Assignee: Hyundai Electronics Industries Co., Ltd., Ichon, Rep. of Korea

[21] Appl. No.: 966,192

[22] Filed: Nov. 7, 1997

[30] Foreign Application Priority Data

Nov. 8, 1996 [KR] Rep. of Korea ............... 1996-52875

[51] Int. Cl.$^6$ ................................. G11C 16/04
[52] U.S. Cl. ................. 365/189.09; 365/189.07; 365/222
[58] Field of Search ............ 365/189.09, 189.07, 365/189.11, 222, 189.08

[56] References Cited

U.S. PATENT DOCUMENTS

| | | |
|---|---|---|
| 4,985,869 | 1/1991 | Miyamoto . |
| 5,315,557 | 5/1994 | Kim et al. . |
| 5,365,487 | 11/1994 | Patel et al. ............................ 365/226 |
| 5,426,613 | 6/1995 | Takahashi et al. .................... 365/222 |
| 5,629,898 | 5/1997 | Idei et al. ............................. 365/222 |

Primary Examiner—David Neims
Assistant Examiner—Hien Nguyen
Attorney, Agent, or Firm—Thelen, Reid & Priest, LLP.

[57] ABSTRACT

A composite mode substrate voltage generation circuit for a DRAM which has a memory cell block and a peripheral circuit block formed on a single substrate. The circuit comprises a back-bias voltage generator for generating a first back-bias voltage in response to a normal refresh mode control signal or a second back-bias voltage in response to a self-refresh mode control signal and supplying the generated first or second back-bias voltage to the memory cell and peripheral circuit blocks, a first voltage level detector for detecting a level of the first back-bias voltage from the back-bias voltage generator, comparing the detected level of the first back-bias voltage with a first reference voltage level and controlling a voltage pumping operation of the back-bias voltage generator in accordance with the compared result, and a second voltage level detector for detecting a level of the second back-bias voltage from the back-bias voltage generator, comparing the detected level of the second back-bias voltage with a second reference voltage level and controlling the voltage pumping operation of the back-bias voltage generator in accordance with the compared result. A self-refresh operation can stably be performed at low power consumption, resulting in an increase in refresh efficiency of the DRAM.

9 Claims, 3 Drawing Sheets

COMPOSITE MODE SUBSTRATE VOLTAGE GENERATION CIRCUIT FOR DYNAMIC RANDOM ACCESS MEMORY

BACKGROUND OF THE INVENTION

1. Field of the Invention

The present invention relates in general to a substrate voltage generation circuit for a semiconductor memory device, and more particularly to a composite mode substrate voltage generation circuit for a dynamic random access memory (referred to hereinafter as DRAM) in which a reference voltage for the generation of a substrate voltage in a self-refresh mode is lower than that in a normal refresh mode, so that a self-refresh operation can stably be performed at low power consumption, resulting in an increase in refresh efficiency of the DRAM.

2. Description of the Prior Art

Generally, a DRAM has operating modes such as a read mode, write mode, refresh mode, etc.. The refresh mode is classified into two modes, or a normal refresh mode and a self-refresh mode. The normal refresh mode is performed when the DRAM is normally operated, and the self-refresh mode is performed by a refresh counter in the DRAM when the DRAM is not accessed.

Because a memory cell access operation is not basically performed in the self-refresh mode, a self-refresh operation requires a period longer than that of a normal refresh operation. The self-refresh period depends on an interval for allowing charge stored in a memory cell not to be lost due to a leakage current.

In the DRAM, each memory cell is composed of one transistor and one capacitor. Charge stored in the capacitor may be lost due to a leakage current, which is generally classified into a junction leakage current at a storage node and a subthreshold leakage current in a subthreshold region of the transistor. Generally, as a semiconductor chip is highly integrated, a memory device becomes smaller in size and thus has a short channel effect. As a result, the subthreshold leakage current accounts for most charge losses in the DRAM cell.

SUMMARY OF THE INVENTION

Therefore, the present invention has been made in view of the above problem, and it is an object of the present invention to provide a composite mode substrate voltage generation circuit for a DRAM in which a substrate voltage applied to a transistor in a self-refresh mode is lower than that in a normal refresh mode, so that a subthreshold leakage current can be reduced by at least twice as compared with a conventional one.

In accordance with one aspect of the present invention, there is provided a composite mode substrate voltage generation circuit for a dynamic random access memory, the memory having a memory cell block and a peripheral circuit block formed on a single substrate, comprising a back-bias voltage generator for generating a first back-bias voltage in response to a normal refresh mode control signal or a second back-bias voltage in response to a self-refresh mode control signal and supplying the generated first or second back-bias voltage to the memory cell and peripheral circuit blocks; a first voltage level detector for detecting a level of the first back-bias voltage from the back-bias voltage generator, comparing the detected level of the first back-bias voltage with a first reference voltage level and controlling a voltage pumping operation of the back-bias voltage generator in accordance with the compared result; and a second voltage level detector for detecting a level of the second back-bias voltage from the back-bias voltage generator, comparing the detected level of the second back-bias voltage with a second reference voltage level and controlling the voltage pumping operation of the back-bias voltage generator in accordance with the compared result.

In accordance with another aspect of the present invention, there is provided a composite mode substrate voltage generation circuit for a dynamic random access memory, the memory having a memory cell block and a peripheral circuit block formed on different wells, comprising first substrate voltage generation means including a first back-bias voltage generator for generating a first back-bias voltage in response to a normal refresh mode control signal and supplying the generated first back-bias voltage in common to the wells of the memory cell and peripheral circuit blocks, and a first voltage level detector for detecting a level of the first back-bias voltage from the first back-bias voltage generator, comparing the detected level of the first back-bias voltage with a first reference voltage level and controlling a voltage pumping operation of the first back-bias voltage generator in accordance with the compared result; and second substrate voltage generation means including a second back-bias voltage generator for generating a second back-bias voltage in response to a self-refresh mode control signal and supplying the generated second back-bias voltage to the well of the memory cell block, and a second voltage level detector for detecting a level of the second back-bias voltage from the second back-bias voltage generator, comparing the detected level of the second back-bias voltage with a second reference voltage level and controlling a voltage pumping operation of the second back-bias voltage generator in accordance with the compared result.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
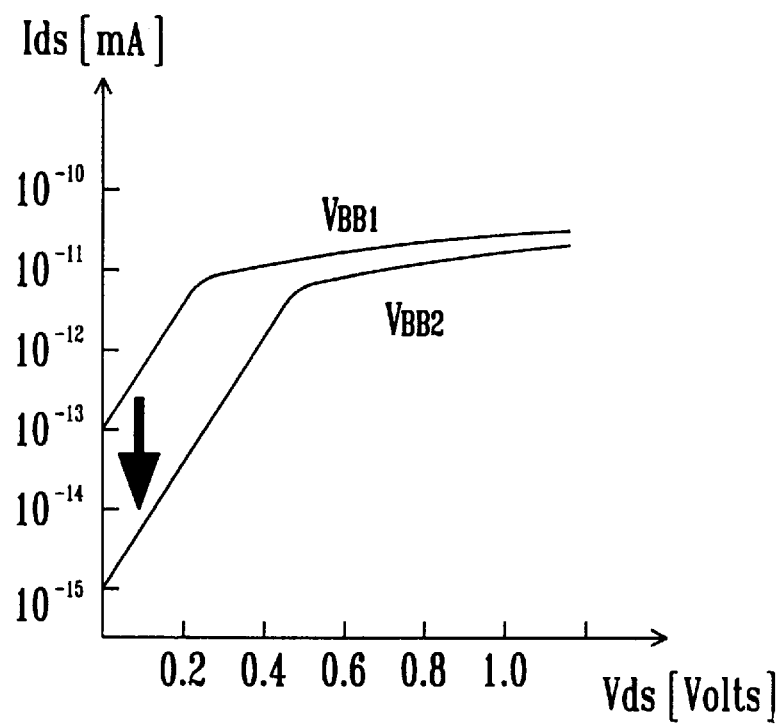
FIG. 1 is a graph illustrating substrate voltage/current relations in accordance with the present invention.

FIG. 1 is a graph illustrating substrate voltage/current relations in accordance with the present invention. In accordance with the present invention, a first back-bias voltage (first substrate voltage) $V_{BB1}$ is applied in a normal refresh mode, and a second back-bias voltage (second substrate voltage) $V_{BB2}$ is applied in a self-refresh mode.

Assuming that the first back-bias voltage $V_{BB1}$ is $-Vb$, the second back-bias voltage $V_{BB2}$ is $-2Vb$ or $-3Vb$. As seen from FIG. 1, because the second back-bias voltage $V_{BB2}$ is lower than the first back-bias voltage $V_{BB1}$, current is reduced in the self-refresh mode, as sell. In the preferred embodiment of the present invention, the first and second back-bias voltages $V_{BB1}$ and $V_{BB2}$ can be obtained by providing the same back-bias voltage pumping circuit in the corresponding voltage generators and merely adjusting detection levels of the corresponding back-bias voltage level detection circuits.

Figure 2:
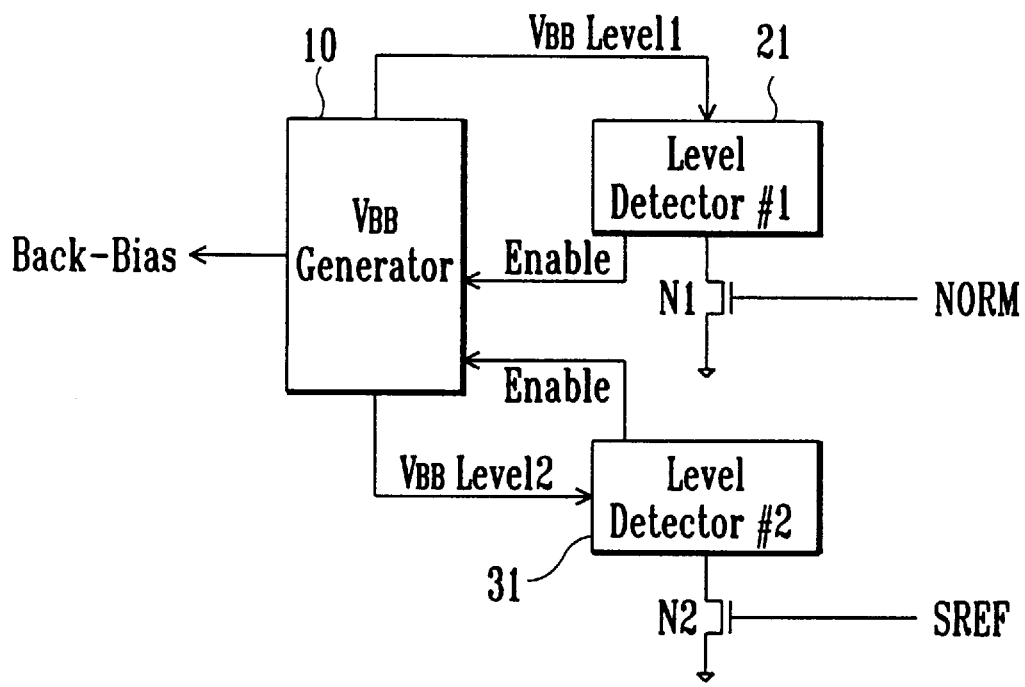
FIG. 2 is a block diagram of a composite mode substrate voltage generation circuit for a DRAM in accordance with an embodiment of the present invention.

FIG. 2 is a block diagram of a composite mode substrate voltage generation circuit for a DRAM in accordance with an embodiment of the present invention. In the embodiment of the present invention, the composite mode substrate voltage generation circuit is adapted to generate different substrate voltages (back-bias voltages) in normal and self-refresh modes and supply the generated substrate voltages in common to memory cell and peripheral circuit blocks of the DRAM.

As shown in FIG. 2, the composite mode substrate voltage generation circuit comprises a back-bias voltage (VBB) generator 10 for generating a first back-bias voltage $V_{BB1}$ in response to a normal refresh mode control signal NORM or a second back-bias voltage $V_{BB2}$ in response to a self-refresh mode control signal SREF and supplying the generated first or second back-bias voltage $V_{BB1}$ or $V_{BB2}$ to the DRAM, a first voltage level detector 21 for detecting a level of the first back-bias voltage $V_{BB1}$ from the back-bias voltage generator 10 and, if the detected level of the first back-bias voltage $V_{BB1}$ is lower than a first reference voltage level, allowing the back-bias voltage generator 10 to perform a voltage pumping operation, and a second voltage level detector 31 for detecting a level of the second back-bias voltage $V_{BB2}$ from the back-bias voltage generator 10 and, if the detected level of the second back-bias voltage $V_{BB2}$ is lower than a second reference voltage level, allowing the back-bias voltage generator 10 to perform the voltage pumping operation.

The operation of the composite mode substrate voltage generation circuit for the DRAM with the above-mentioned construction in accordance with the embodiment of the present invention will hereinafter be described in detail.

If the normal refresh mode control signal NORM is high in logic to indicate the execution of the normal refresh mode, an NMOS transistor N1 is turned on to drive the back-bias voltage generator 10.

As the back-bias voltage generator 10 is driven, it generates the first back-bias voltage $V_{BB1}$ and applies it to the memory cell and peripheral circuit blocks of the DRAM. Also, the first back-bias voltage $V_{BB1}$ from the back-bias voltage generator 10 is fed back to the first voltage level detector 21. In the first voltage level detector 21, the first reference voltage level is set to allow the first back-bias voltage $V_{BB1}$ from the back-bias voltage generator 10 to be applied to the memory cell and peripheral circuit blocks of the DRAM when a normal refresh operation is performed.

The first voltage level detector 21 detects the level of the first back-bias voltage $V_{BB1}$ from the back-bias voltage generator 10 and compares the detected level of the first back-bias voltage $V_{BB1}$ with the first reference voltage level. If the detected level of the first back-bias voltage $V_{BB1}$ is not lower than the first reference voltage level, the first voltage level detector 21 does not output an enable signal to the back-bias voltage generator 10 so that the back-bias voltage generator 10 cannot perform the voltage pumping operation.

Thereafter, at the time that the detected level of the first back-bias voltage $V_{BB1}$ becomes lower than the first reference voltage level, the first voltage level detector 21 outputs the enable signal to the back-bias voltage generator 10 so that the back-bias voltage generator 10 can perform the voltage pumping operation. In this manner, the first back-bias voltage $V_{BB1}$ from the back-bias voltage generator 10 is maintained constantly in level.

On the other hand, when the DRAM is not accessed, the self-refresh mode control signal SREF becomes high in logic to indicate the execution of the self-refresh mode. As a result, an NMOS transistor N2 is turned on to drive the back-bias voltage generator 10.

As the back-bias voltage generator 10 is driven, it generates the second back-bias voltage $V_{BB2}$ and applies it to the memory cell and peripheral circuit blocks of the DRAM. Also, the second back-bias voltage $V_{BB2}$ from the back-bias voltage generator 10 is fed back to the second voltage level detector 31.

In the second voltage level detector 31, the second reference voltage level is set to a low value of twice or three times the first reference voltage set in the first voltage level detector 21. The second voltage level detector 31 detects the level of the second back-bias voltage $V_{BB2}$ from the back-bias voltage generator 10 and compares the detected level of the second back-bias voltage $V_{BB2}$ with the second reference voltage level. If the detected level of the second back-bias voltage $V_{BB2}$ is lower than the second reference voltage level, the second voltage level detector 31 outputs an enable signal to the back-bias voltage generator 10 so that the back-bias voltage generator 10 can perform the voltage pumping operation.

As mentioned above, in accordance with the embodiment of the present invention, the first and second voltage level detectors 21 and 31 are provided to allow the back-bias voltage generator 10 to supply different substrate voltages (back-bias voltages) in the normal and self-refresh modes, resulting in a reduction in the amount of leakage current in a subthreshold region. This embodiment is applicable to a P-type substrate in a twin-well process because a threshold voltage of a CMOS transistor is generally less sensitive to a substrate voltage.

Figure 3:
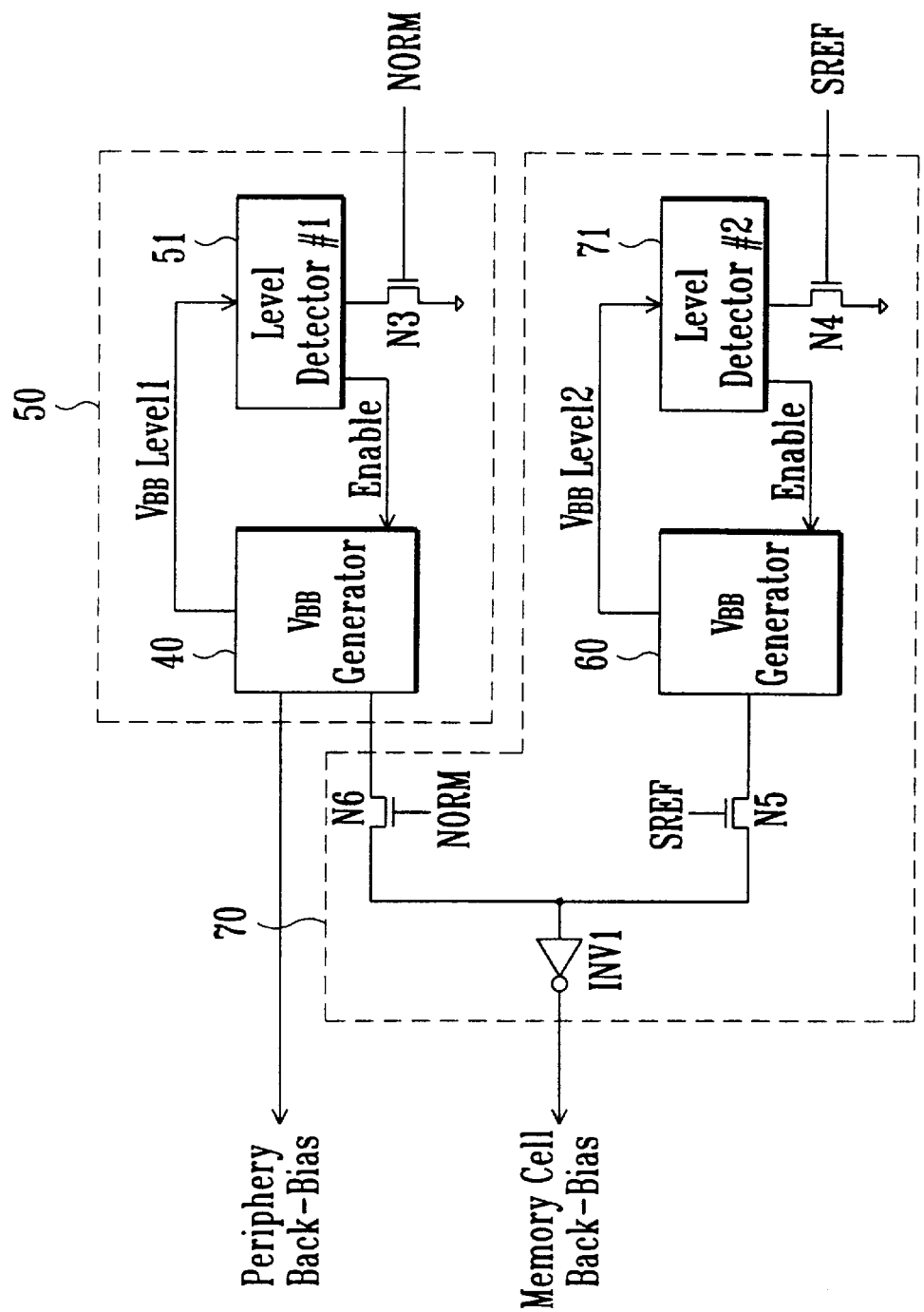
FIG. 3 is a block diagram of a composite mode substrate voltage generation circuit for a DRAM in accordance with an alternative embodiment of the present invention.

FIG. 3 is a block diagram of a composite mode substrate voltage generation circuit for a DRAM in accordance with an alternative embodiment of the present invention. Noticeably, memory cell and peripheral circuit blocks of the DRAM can be separated from each other by different wells in a triple-well process. In this connection, in the second embodiment of the present invention, the composite mode substrate voltage generation circuit is adapted to supply a lower substrate voltage to only the memory cell block of the DRAM in a self-refresh mode.

As shown in FIG. 3, the composite mode substrate voltage generation circuit comprises first and second substrate voltage generation circuits 50 and 70.

The first substrate voltage generation circuit 50 includes a first back-bias voltage generator 40 for generating a first back-bias voltage $V_{BB1}$ in response to a normal refresh mode control signal NORM and supplying the generated first back-bias voltage $V_{BB1}$ in common to wells of the memory cell and peripheral circuit blocks of the DRAM, and a first voltage level detector 51 for detecting a level of the first back-bias voltage $V_{BB1}$ from the first back-bias voltage generator 40 and, if the detected level of the first back-bias voltage $V_{BB1}$ is lower than a first reference voltage level, allowing the first back-bias voltage generator 40 to perform a voltage pumping operation.

The second substrate voltage generation circuit 70 includes a second back-bias voltage generator 60 for generating a second back-bias voltage $V_{BB2}$ in response to a self-refresh mode control signal SREF and supplying the generated second back-bias voltage $V_{BB2}$ to the well of the memory cell block of the DRAM, and a second voltage level detector 71 for detecting a level of the second back-bias voltage $V_{BB2}$ from the second back-bias voltage generator 60 and, if the detected level of the second back-bias voltage $V_{BB2}$ is lower than a second reference voltage level, allowing the second back-bias voltage generator 60 to perform a voltage pumping operation.

The second substrate voltage generation circuit 70 further includes an NMOS transistor N5 having its gate for inputting the self-refresh mode control signal SREF and its one terminal connected to an output terminal of the second back-bias voltage generator 60, an NMOS transistor N6 having its gate for inputting the normal refresh mode control signal NORM and its one terminal connected to an output terminal of the first back-bias voltage generator 40, and an inverter INV1 having its input terminal connected in common to the other terminals of the NMOS transistors N5 and N6 and its output terminal connected to the well of the memory cell block of the DRAM.

The operation of the composite mode substrate voltage generation circuit for the DRAM with the above-mentioned construction in accordance with the second embodiment of the present invention will hereinafter be described in detail.

If the normal refresh mode control signal NORM is high in logic to indicate the execution of the normal refresh mode, an NMOS transistor N3 is turned on to drive the first back-bias voltage generator 40 in the first substrate voltage generation circuit 50. Then in the first substrate voltage generation circuit 50, as the first back-bias voltage generator 40 is driven, it generates the first back-bias voltage $V_{BB1}$ and applies it to the well of the peripheral circuit block of the DRAM. Also, the first back-bias voltage $V_{BB1}$ from the first back-bias voltage generator 40 is fed back to the first voltage level detector 51.

The first voltage level detector 51 detects the level of the first back-bias voltage $V_{BB1}$ from the first back-bias voltage generator 40 and compares the detected level of the first back-bias voltage $V_{BB1}$ with the first reference voltage level. If the detected level of the first back-bias voltage $V_{BB1}$ is lower than the first reference voltage level, the first voltage level detector 51 outputs an enable signal to the first back-bias voltage generator 40 so that the first back-bias voltage generator 40 can perform the voltage pumping operation.

In the second substrate voltage generation circuit 70, the NMOS transistor N6 is turned on in response to the normal refresh mode control signal NORM to supply the first back-bias voltage $V_{BB1}$ from the first back-bias voltage generator 40 to the well of the memory cell block of the DRAM.

As a result, in the normal refresh mode, the first back-bias voltage $V_{BB1}$ from the first back-bias voltage generator 40 is applied in common to the wells of the memory cell and peripheral circuit blocks of the DRAM.

On the other hand, when the DRAM is not accessed, the self-refresh mode control signal SREF becomes high in logic to indicate the execution of the self-refresh mode. As a result, an NMOS transistor N4 is turned on to drive the second back-bias voltage generator 60 in the second substrate voltage generation circuit 70. Then in the second substrate voltage generation circuit 70, as the second back-bias voltage generator 60 is driven, it generates the second back-bias voltage $V_{BB2}$ which is fed back to the second voltage level detector 71.

In the second voltage level detector 71, the second reference voltage level is set to a low value of twice or three times the first reference voltage set in the first voltage level detector 51. The second voltage level detector 71 detects the level of the second back-bias voltage $V_{BB2}$ from the second back-bias voltage generator 60 and compares the detected level of the second back-bias voltage $V_{BB2}$ with the second reference voltage level. If the detected level of the second back-bias voltage $V_{BB2}$ is lower than the second reference voltage level, the second voltage level detector 71 outputs an enable signal to the second back-bias voltage generator 60 so that the second back-bias voltage generator 60 can perform the voltage pumping operation.

Also in the second substrate voltage generation circuit 70, the NMOS transistor N5 is turned on in response to the self-refresh mode control signal SREF to supply the second back-bias voltage $V_{BB2}$ from the second back-bias voltage generator 60 to the well of the memory cell block of the DRAM.

As a result, in the self-refresh mode, the second back-bias voltage $V_{BB2}$ from the second back-bias voltage generator 60 is applied to only the well of the memory cell block of the DRAM.

As mentioned above, in accordance with the second embodiment of the present invention, the first back-bias voltage generator 40 is operated in the normal refresh mode to supply the first back-bias voltage in common to the memory cell and peripheral circuit blocks of the DRAM, and the second back-bias voltage generator 60 is operated in the self-refresh mode to supply the second back-bias voltage to only the memory cell block of the DRAM.

As apparent from the above description, according to the present invention, different substrate voltages are supplied in the normal and self-refresh modes. Because the substrate voltage in the self-refresh mode is lower than that in the normal refresh mode, a subthreshold characteristic of the DRAM cell is improved, resulting in a reduction in the amount of leakage current in a subthreshold region. Therefore, the self-refresh period is relatively increased, resulting in a reduction in the number of refresh operations within a given time and, thus, a reduction in chip power consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A composite mode substrate voltage generation circuit for a dynamic random access memory, said memory having a memory cell block and a peripheral circuit block formed on a single substrate, comprising:

a back-bias voltage generator for generating a first back-bias voltage in response to a normal refresh mode control signal or a second back-bias voltage in response to a self-refresh mode control signal and supplying the generated first or second back-bias voltage to said memory cell and peripheral circuit blocks;

a first voltage level detector for detecting a level of said first back-bias voltage from said back-bias voltage generator, comparing the detected level of said first back-bias voltage with a first reference voltage level and controlling a voltage pumping operation of said back-bias voltage generator in accordance with the compared result; and a second voltage level detector for detecting a level of said second back-bias voltage from said back-bias voltage generator, comparing the detected level of said second back-bias voltage with a second reference voltage level and controlling said voltage pumping operation of said back-bias voltage generator in accordance with the compared result.

2. A composite mode substrate voltage generation circuit for a dynamic random access memory, as set forth in claim 1, wherein said second reference voltage level has a low value of at least twice said first reference voltage level.

3. A composite mode substrate voltage generation circuit for a dynamic random access memory, as set forth in claim 1, wherein said first voltage level detector is adapted to output an enable signal to said back-bias voltage generator if the detected level of said first back-bias voltage is lower than said first reference voltage level, to allow said back-bias voltage generator to perform said voltage pumping operation.

4. A composite mode substrate voltage generation circuit for a dynamic random access memory, as set forth in claim 1, wherein said second voltage level detector is adapted to output an enable signal to said back-bias voltage generator if the detected level of said second back-bias voltage is lower than said second reference voltage level, to allow said back-bias voltage generator to perform said voltage pumping operation.

5. A composite mode substrate voltage generation circuit for a dynamic random access memory, said memory having a memory cell block and a peripheral circuit block formed on different wells, comprising:

first substrate voltage generation means including a first back-bias voltage generator for generating a first back-bias voltage in response to a normal refresh mode control signal and supplying the generated first back-bias voltage in common to said wells of said memory cell and peripheral circuit blocks, and a first voltage level detector for detecting a level of said first back-bias voltage from said first back-bias voltage generator, comparing the detected level of said first back-bias voltage with a first reference voltage level and controlling a voltage pumping operation of said first back-bias voltage generator in accordance with the compared result; and second substrate voltage generation means including a second back-bias voltage generator for generating a second back-bias voltage in response to a self-refresh mode control signal and supplying the generated second back-bias voltage to said well of said memory cell block, and a second voltage level detector for detecting a level of said second back-bias voltage from said second back-bias voltage generator, comparing the detected level of said second back-bias voltage with a second reference voltage level and controlling a voltage pumping operation of said second back-bias voltage generator in accordance with the compared result.

6. A composite mode substrate voltage generation circuit for a dynamic random access memory, as set forth in claim 5, wherein said second substrate voltage generation means further includes:

a first NMOS transistor having its gate for inputting said self-refresh mode control signal and its one terminal connected to an output terminal of said second back-bias voltage generator;

a second NMOS transistor having its gate for inputting said normal refresh mode control signal and its one terminal connected to an output terminal of said first back-bias voltage generator; and an inverter having its input terminal connected in common to the other terminals of said first and second NMOS transistors and its output terminal connected to said well of said memory cell block.

7. A composite mode substrate voltage generation circuit for a dynamic random access memory, as set forth in claim 5, wherein said second reference voltage level has a low value of at least twice said first reference voltage level.

8. A composite mode substrate voltage generation circuit for a dynamic random access memory, as set forth in claim 5, wherein said first voltage level detector is adapted to output an enable signal to said first back-bias voltage generator if the detected level of said first back-bias voltage is lower than said first reference voltage level, to allow said first back-bias voltage generator to perform said voltage pumping operation.

9. A composite mode substrate voltage generation circuit for a dynamic random access memory, as set forth in claim 5, wherein said second voltage level detector is adapted to output an enable signal to said second back-bias voltage generator if the detected level of said second back-bias voltage is lower than said second reference voltage level, to allow said second back-bias voltage generator to perform said voltage pumping operation.

* * * * *